(12) United States Patent
Wu et al.

(10) Patent No.: US 9,698,377 B1
(45) Date of Patent: Jul. 4, 2017

(54) COPOLYMER AND RESIN COMPOSITION, PACKAGING FILM AND PACKAGE STRUCTURE INCLUDING THE SAME

(71) Applicant: INDUSTRIAL TECHNOLOGY RESEARCH INSTITUTE, Hsinchu (TW)

(72) Inventors: Ming-Tzung Wu, Mailiao Township (TW); Te-Yi Chang, Taoyuan (TW); Yao-Jheng Huang, Taipei (TW); Yun-Yu Lai, Qionglin Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/386,400

(22) Filed: Dec. 21, 2016

(30) Foreign Application Priority Data

May 6, 2016 (TW) .............................. 105114088 A

(51) Int. Cl.
*H01L 23/28* (2006.01)
*H01L 23/29* (2006.01)
(Continued)

(52) U.S. Cl.
CPC ........ *H01L 51/5253* (2013.01); *C08F 283/12* (2013.01); *C08L 51/085* (2013.01);
(Continued)

(58) Field of Classification Search
CPC ........ C08F 10/00; C08F 210/00; C08L 61/34; C08L 9/00; C08L 9/02; C08L 23/00;
(Continued)

(56) References Cited

U.S. PATENT DOCUMENTS 5,825,526 A 10/1998 Bommarito et al.
6,228,464 B1 5/2001 Miyaji
(Continued)

FOREIGN PATENT DOCUMENTS

CN 1067941 C 7/2001
CN 1860170 A 11/2006
(Continued)

OTHER PUBLICATIONS

Idojiri et al. "Apparatus for Manufacturing Flexible OLED Displays: Adoption of Transfer Technology", SID 2015 DIGEST, pp. 8-11.
(Continued)

*Primary Examiner* — Jasmine Clark
(74) *Attorney, Agent, or Firm* — Birch, Stewart, Kolasch & Birch, LLP

(57) ABSTRACT

A copolymer according to the present disclosure is provided, which includes 30 to 80 mol % of a repeating unit represented by formula (I), 5 to 25 mol % of a repeating unit represented by formula (II), and 5 to 30 mol % of a repeating unit represented by formula (III):

formula (I)

(Continued)

-continued

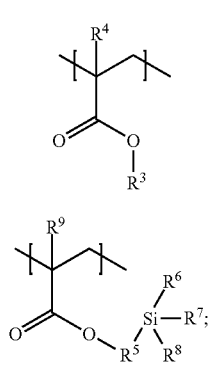

formula (II)

formula (III)

wherein $R^1$ is C6-C13 aryl group, C7-C13 aralkyl group, C6-C8 halogenated aryl group or C7-C8 aryloxyalkyl group; $R^3$ is C3-C16 alkyl group or C3-C6 alkoxy substituted alkyl group; $R^5$ is a single bond or C1-C3 alkylene group, $R^6$ and $R^7$ are independently C1-C3 alkoxy group, $R^8$ is polysiloxane with methyl and phenyl groups; and $R^2$, $R^4$ and $R^9$ are independently hydrogen or methyl. In addition, a resin composition, a packaging film and a package structure including the same are provided.

24 Claims, 1 Drawing Sheet

(51) Int. Cl.
  H01L 51/52      (2006.01)
  C08F 283/12     (2006.01)
  C08L 51/08      (2006.01)
  H01L 51/00      (2006.01)
(52) U.S. Cl.
  CPC ........ *H01L 51/004* (2013.01); *H01L 51/0043* (2013.01); *C08L 2203/16* (2013.01); *C08L 2203/206* (2013.01); *H01L 51/0096* (2013.01); *H01L 2251/301* (2013.01); *H01L 2251/303* (2013.01); *H01L 2251/558* (2013.01)
(58) Field of Classification Search
  CPC ........... C08L 2203/206; C08L 2203/16; H01L 51/0043; H01L 2924/0645; H01L 2251/30
  See application file for complete search history.

(56) References Cited

U.S. PATENT DOCUMENTS

| | | | |
|---|---|---|---|
| 6,682,872 B2 | 1/2004 | Sachdev et al. | |
| 7,923,629 B2 | 4/2011 | Park et al. | |
| 2002/0013389 A1 | 1/2002 | Taylor et al. | |
| 2002/0193552 A1* | 12/2002 | Kiuchi | C08G 14/10 528/163 |
| 2003/0166760 A1 | 9/2003 | Taylor et al. | |
| 2004/0024106 A1* | 2/2004 | Kim | C08L 67/02 524/494 |
| 2004/0024151 A1 | 2/2004 | Becker et al. | |
| 2004/0065232 A1 | 4/2004 | Lykke | |
| 2004/0242803 A1 | 12/2004 | Ohme et al. | |
| 2005/0154148 A1 | 7/2005 | Nakamichi et al. | |
| 2005/0171292 A1 | 8/2005 | Zang et al. | |
| 2005/0255320 A1 | 11/2005 | Noguchi | |
| 2005/0277640 A1 | 12/2005 | Dixon et al. | |
| 2006/0032403 A1 | 2/2006 | Kaupp et al. | |
| 2006/0229376 A1* | 10/2006 | Hayashi | G02B 5/223 522/6 |
| 2007/0117817 A1 | 5/2007 | Dixon et al. | |
| 2007/0260019 A1 | 11/2007 | Ohme et al. | |
| 2009/0004086 A1 | 1/2009 | Kuhling et al. | |
| 2009/0075038 A1 | 3/2009 | Butler et al. | |
| 2009/0105385 A1 | 4/2009 | Park | |
| 2010/0040741 A1 | 2/2010 | Butler et al. | |
| 2011/0098301 A1 | 4/2011 | Dixon et al. | |
| 2011/0160364 A1 | 6/2011 | Toyohara et al. | |
| 2011/0224385 A1 | 9/2011 | Shoji et al. | |
| 2011/0263762 A1 | 10/2011 | Matsuno et al. | |
| 2012/0225983 A1 | 9/2012 | Wagner et al. | |
| 2012/0245267 A1 | 9/2012 | Blanchard et al. | |
| 2012/0251750 A1 | 10/2012 | Sybert et al. | |
| 2012/0252961 A1 | 10/2012 | Sybert et al. | |
| 2012/0267480 A1 | 10/2012 | Sybert et al. | |
| 2012/0269994 A1 | 10/2012 | Sybert et al. | |
| 2012/0273738 A1 | 11/2012 | Sybert et al. | |
| 2012/0289625 A1 | 11/2012 | Matsuno et al. | |
| 2013/0005875 A1 | 1/2013 | Shoji et al. | |
| 2013/0085240 A1 | 4/2013 | Sybert et al. | |
| 2013/0146816 A1* | 6/2013 | Liang | C09J 163/00 252/500 |
| 2013/0274366 A1 | 10/2013 | Jin | |
| 2013/0284991 A1 | 10/2013 | Sybert et al. | |
| 2014/0066555 A1 | 3/2014 | Matsuno et al. | |
| 2014/0206807 A1 | 7/2014 | Sudo et al. | |
| 2014/0349091 A1 | 11/2014 | Yan et al. | |
| 2015/0064457 A1 | 3/2015 | Chen et al. | |
| 2015/0119483 A1 | 4/2015 | Sybert et al. | |
| 2015/0166827 A1 | 6/2015 | Chen et al. | |
| 2015/0175802 A1 | 6/2015 | Sybert et al. | |
| 2015/0218423 A1 | 8/2015 | Thebud et al. | |
| 2015/0225612 A1 | 8/2015 | Ebenau et al. | |
| 2015/0259504 A1 | 9/2015 | Takahashi et al. | |

FOREIGN PATENT DOCUMENTS

| | | | |
|---|---|---|---|
| CN | 101039801 B | | 5/2012 |
| CN | 102640564 A | | 8/2012 |
| CN | 103155701 A | | 6/2013 |
| CN | 103178215 A | | 6/2013 |
| CN | 103187370 A | | 7/2013 |
| CN | 103946998 A | | 7/2014 |
| CN | 103998230 A | | 8/2014 |
| CN | 104327458 A | | 2/2015 |
| KR | 10-2009-0028766 | * | 3/2009 |
| TW | I401487 B | | 7/2013 |
| TW | I500090 B | | 9/2015 |

OTHER PUBLICATIONS

Kan et al., "Study on the Preparation and Properties of Styrene-Butyl Acrylate-Silicone Copolymer Latices", J Appl Polym Sci, vol. 82, 2001, pp. 3194-3200.

Rodríguez et al., "Correlation of Silicone Incorporation into Hybrid Acrylic Coatings with the Resulting Hydrophobic and Thermal Properties", Macromolecules, vol. 41, issue 22, 2008 (Published on web Oct. 31, 2008), pp. 8537-8546.

Sonnenschein et al., "Poly(acrylate/siloxane) hybrid adhesives for polymers with low surface energy", International Journal of Adhesion & Adhesives, vol. 28, 2008 (available online Aug. 11, 2007), pp. 126-134.

Taiwanese Office Action and Search Report dated Aug. 18, 2016 for Application No. 105114088.

Zhang et al., "Study on siloxane-acrylic aqueous dispersions for use in exterior decorative coatings", Surface Coatings International Part B: Coatings Transactions, vol. 88, No. B2, May 2005, pp. 107-111.

* cited by examiner

COPOLYMER AND RESIN COMPOSITION, PACKAGING FILM AND PACKAGE STRUCTURE INCLUDING THE SAME

CROSS-REFERENCE TO RELATED APPLICATION

This application claims the priority benefit of Taiwan application serial no. 105114088, filed on May 6, 2016. The entirety of the above-mentioned patent application is hereby incorporated by reference herein and made a part of this specification.

TECHNICAL FIELD

The disclosure relates to an acrylate copolymer and a resin composition, a packaging film and a package structure including the same.

BACKGROUND

Recently, Organic Light-Emitting Diode (OLED) elements have been developed toward large-area, thin-type and flexible substrate. However, the OLED elements are a kind of polycrystalline semiconductor being prone to be affected by oxygen or moisture, thereby resulting in the deterioration of the OLED elements. Therefore, the OLED elements need to be externally encapsulated so as to prevent influx of ambient gas.

The common encapsulation methods applied to OLEDs are the glass-frit technique and the "dam & filling" technique. The glass-frit technique is capable of resisting oxygen or moisture, but is not suitable for the large-area, thin and flexible elements. The dam & filling technique is not only capable of resisting oxygen or moisture, but also has high mechanical strength for encapsulation, but that technique is complicated and is not suitable for the large-area or roll-to-roll process.

Based on the above, the development of a novel encapsulating material applied to the encapsulation of large-area, thin-type and flexible OLEDs is urgent without delay.

SUMMARY

The present disclosure provides a copolymer, which includes 30 to 80 mol % of a repeating unit represented by formula (I), 5 to 25 mol % of a repeating unit represented by formula (II), and 5 to 30 mol % of a repeating unit represented by formula (III)

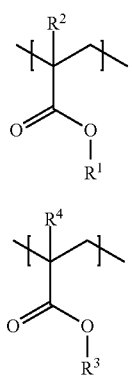

formula (I)

formula (II)

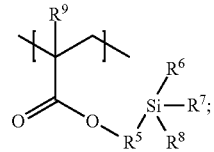

formula (III)

wherein $R^1$ is C6-C13 aryl group, C7-C13 aralkyl group, C6-C8 halogenated aryl group or C7-C8 aryloxyalkyl group; $R^3$ is C3-C16 alkyl group or C3-C6 alkoxy substituted alkyl group; $R^5$ is a single bond or C1-C3 alkylene group, $R^6$ and $R^7$ are independently C1-C3 alkoxy group, $R^8$ is polysiloxane with methyl and phenyl groups; and $R^2$, $R^4$ and $R^9$ are independently hydrogen or methyl.

The present disclosure provides a resin composition, which includes the aforementioned copolymer and an epoxy, wherein a weight ratio of the epoxy to the copolymer is from 0.01 to 1.

The present disclosure provides a packaging film, which includes a substrate; a release layer disposed on the substrate; a gas barrier layer disposed on the release layer; and a resin layer disposed on the gas barrier layer and comprising the aforementioned resin composition.

The present disclosure provides a package structure, which includes a substrate; a semiconductor element disposed on the substrate; a resin layer encapsulating the semiconductor element and comprising the aforementioned resin composition; and a gas barrier layer disposed on the resin layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
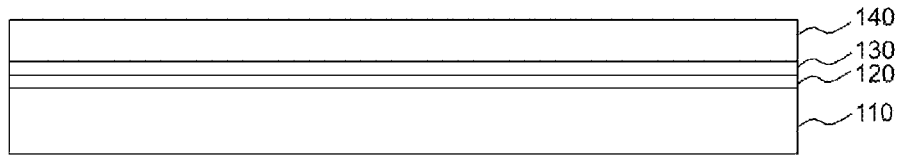
FIG. 1 is a schematic diagram showing the packaging film according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As used in the specification and claims, the singular forms "a", "an" and "the" include plural references unless the context clearly dictates otherwise.

The present disclosure is a copolymer synthesized by a series of polymerization from a first acrylate, a second acrylate and a third acrylate or a first acrylate, a second acrylate, a third acrylate and a fourth acrylate. In some embodiments, a free radical polymerization is conducted to form a resin precursor first. Subsequently, the resin precursor is reacted with a silicone oligomer by a condensation polymerization to form the copolymer of the present disclosure. The first acrylate includes aryl group, aralkyl group, halogenated aryl group or aryloxyalkyl group so as to enhance the heat resistance and the compatibility of the copolymer. The second acrylate includes a long chain alkyl group or an alkoxy substituted alkyl group so as to promote the flexibility and the thermal transfer properties of the copolymer. The third acrylate is a (meth)acrylic silane such as (meth)acryloxy alkyl alkoxysilane and (meth)acryloxy alkoxysilane, and may be grafted with the silicone oligomer through the silane group so as to improve the heat resistance and the yellowing resistance of the copolymer. The fourth acrylate may be exemplified by acrylic acid, methacrylic acid, methacrylate, methyl methacrylate, hydroxyethyl methacrylate, hydroxyethyl acrylate, hydroxypropyl methacrylate, hydroxypropyl acrylate or a combination thereof, and may further improve the adhesion with the substrates.

In some embodiments, the first acrylate can be exemplified by benzyl acrylate, benzyl methacrylate, benzhydryl acrylate, benzhydryl methacrylate, 4-chlorophenyl acrylate, 4-chlorophenyl methacrylate, pentabromophenyl acrylate, pentabromophenyl methacrylate, pentafluorophenyl acrylate, pentafluorophenyl methacrylate, 2-phenoxyethyl acrylate, 2-phenoxyethyl methacrylate, phenyl acrylate, phenyl methacrylate, 2-phenylethyl acrylate, 2-phenylethyl methacrylate, 2,4,6-tribromophenyl acrylate, 2,4,6-tribromophenyl methacrylate or a combination thereof, but it is not limited thereto.

In some embodiments, the second acrylate can be exemplified by tert-amyl acrylate, tert-amyl methacrylate, 2-n-butoxyethyl acrylate, 2-n-butoxyethyl acrylate, iso-butyl acrylate, iso-butyl methacrylate, tert-butyl acrylate, tert-butyl methacrylate, n-butyl acrylate, n-butyl methacrylate, sec-butyl acrylate, sec-butyl methacrylate, iso-decyl acrylate, iso-decyl methacrylate, n-decyl acrylate, n-decyl methacrylate, n-dodecyl acrylate, n-dodecyl methacrylate, 2-(2-ethoxyethoxy)ethyl acrylate, 2-(2-ethoxyethoxy)ethyl methacrylate, 2-ethylhexyl acrylate, 2-ethylhexyl methacrylate, 1-hexadecyl acrylate, 1-hexadecyl methacrylate, n-hexyl acrylate, n-hexyl methacrylate, 2-methoxyethyl acrylate, 2-methoxyethyl methacrylate, n-octyl acrylate, n-octyl methacrylate, n-propyl acrylate, n-propyl methacrylate or a combination thereof, but it is not limited thereto.

In some embodiments, the third acrylate can be exemplified by methacryloxytrimethoxysilane, acryloxytrimethoxysilane, methacryloxytriethoxysilane, acryloxytriethoxysilane, methacryloxymethyltrimethoxysilane, acryloxymethyltrimethoxysilane, methacryloxymethyltriethoxysilane, acryloxymethyltriethoxysilane, 3-(dimethoxymethylsilyl)propyl methacrylate, 3-(dimethoxymethylsilyl)propyl acrylate, 3-(trimethoxysilyl)propyl acrylate, 3-(trimethoxysilyl)propyl methacrylate, 3-(diethoxymethylsilyl)propyl methacrylate, 3-(diethoxymethylsilyl)propyl acrylate, 3-(triethoxysilyl)propyl methacrylate, 3-(triethoxysilyl)propyl acrylate or a combination thereof, but it is not limited thereto.

In some embodiments, the silicone oligomer can be exemplified by Dow Corning 804, Dow Corning 805, Dow Corning 806, Dow Corning 840, Dow Corning 409 or Dow Corning431 (purchased from Dow Corning Corporation), but it is not limited thereto. In some embodiments, the silicone oligomer includes methyl and phenyl groups, and has a weight average molecular weight of 500 to 20000 and a molar ratio of phenyl groups to methyl groups of 0.5 to 3. When the weight average molecular weight of the silicone oligomer is larger than 20000, the overall reactivity can become worse. When the weight average molecular weight of the silicone oligomer is less than 500, the heat resistance of the copolymer can be insufficient. The molar ratio of phenyl groups to methyl groups can affect the heat resistance and the yellowing resistance of the copolymer and the compatibility between the silicone oligomer and the acrylate.

The acrylate resin has properties of high light transmittance and high adhesion, but cannot endure high temperature. However, the silicone resin has the property of heat resistance. Therefore, the acrylate resin was grafted with the silicone resin to form a copolymer having the properties of yellowing resistance, heat resistance, high adhesion and flexibility in the present disclosure. In some embodiments, the copolymer can be used as a thermal transfer material for encapsulation, but its application fields are not limited thereto.

The present disclosure provides a copolymer, which includes 30 to 80 mol % of a repeating unit represented by formula (I), 5 to 25 mol % of a repeating unit represented by formula (II), and 5 to 30 mol % of a repeating unit represented by formula (III)

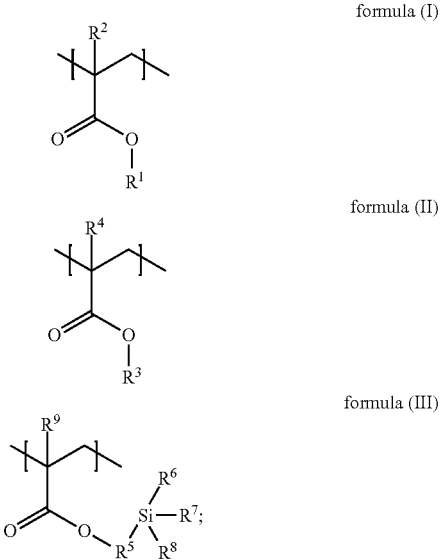

wherein $R^1$ is C6-C13 aryl group, C7-C13 aralkyl group, C6-C8 halogenated aryl group or C7-C8 aryloxyalkyl group; $R^3$ is C3-C16 alkyl group or C3-C6 alkoxy substituted alkyl group; $R^5$ is a single bond or C1-C3 alkylene group; $R^6$ and $R^7$ are independently C1-C3 alkoxy group; $R^8$ is polysiloxane with methyl and phenyl groups; and $R^2$, $R^4$ and $R^9$ are independently hydrogen or methyl.

In some embodiments, the repeating unit represented by formula (I), the repeating unit represented by formula (II) and the repeating unit represented by formula (III) are arranged in an irregular or intermittent order.

In some embodiments, $R^1$ can be benzyl, phenyl, phenylethyl, chlorophenyl, pentabromophenyl, pentafluorophenyl, tribromophenyl, benzhydryl or phenoxyethyl, but it is not limited thereto.

In some embodiments, $R^3$ can be tert-amyl, n-butoxyethyl, tert-butyl, n-butyl, iso-butyl, sec-butyl, iso-decyl, n-decyl, n-dodecyl, ethoxyethoxy ethyl, ethylhexy, hexadecyl, n-hexyl, methoxyethyl, n-octyl or n-propyl, but it is not limited thereto.

In some embodiments, $R^5$ can be a single bond or propylene, $R^6$ and $R^7$ are independently methoxy or ethoxy, but it is not limited thereto.

In some embodiments, a repeating unit of the polysiloxane includes

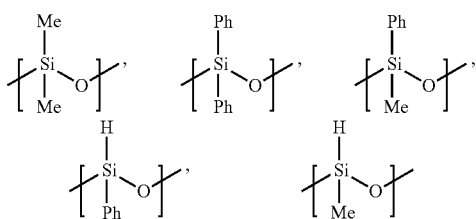

or a combination thereof, wherein Me is methyl, and Ph is phenyl. In some embodiments, the polysiloxane has 7 to 700 repeating units, a weight average molecular weight of 500 to 20000, and a molar ratio of phenyl groups to methyl groups of 3 or less, such as 0.5 to 2.5.

In some embodiments, R8 can be polymethylphenylsiloxane, polydimethylmethylphenyl siloxane, polydiphenylmethylphenyl siloxane, and polydimethyldiphenylsiloxane, but it is not limited thereto.

In some embodiments, the copolymer further includes a repeating unit represented by formula (IV):

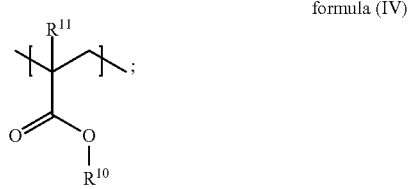

formula (IV)

wherein $R^{10}$ is hydrogen, methyl, hydroxyethyl or hydroxypropyl; and $R^{11}$ is hydrogen or methyl.

In some embodiments, the repeating unit represented by formula (I), the repeating unit represented by formula (II), the repeating unit represented by formula (III) and the repeating unit represented by formula (IV) are arranged in an irregular or intermittent order, wherein the copolymer includes 30 to 50 mol % of a repeating unit represented by formula (I), 5 to 25 mol % of a repeating unit represented by formula (II), 5 to 30 mol % of a repeating unit represented by formula (III), and 10 to 30 mol % of a repeating unit represented by formula (IV).

In some embodiments, the copolymer of the present disclosure may be used for resin compositions, packaging films and package structures, but it is not limited thereto.

The present disclosure provides a resin composition, which includes the aforementioned copolymer and an epoxy, wherein a weight ratio of the epoxy to the copolymer is from 0.01 to 1, such as 0.01 to 0.2.

In some embodiments, the epoxy has a content of 5 to 10% by weight based on the total weight of the resin composition, and can be exemplified by Epon 825, Epon 826, Epon 827, Epon 828, Epon 830, Epon 834, Epon 862 or Epon 863 (purchased from Shell Chemical Corporation), but it is not limited thereto. The epoxy has a weight average molecular weight of 150 to 300 and a viscosity of 3 to 300 cps. The epoxy may enhance the chemical resistance of the resin composition and the crosslink density during film formation. When the weight average molecular weight of the epoxy is greater than 300, the crosslinking reaction can be affected.

In some embodiments, the resin composition further includes a solvent, which has a content of 40 to 80% by weight based on the total weight of the resin composition. The solvent can be exemplified by propylene glycol monomethyl ether acetate (PGMEA), acetylacetone, acetone, cyclohexanone, ethyl acetate or tetrahydrofuran, but it is not limited thereto.

In some embodiments, the resin composition further includes an accelerator, which has a content of 0.05 to 5% by weight based on the total weight of the resin composition. The accelerator can be exemplified by imidazole, aliphatic amine, polyamine, polyetheramine or piperazine, but it is not limited thereto.

FIG. 1 is a schematic diagram showing the packaging film 100 according to one embodiment of the present disclosure. The packaging film 100 includes a substrate 110, a release layer 120, a gas barrier layer 130 and a resin layer 140. The release layer 120 is disposed on the substrate 110, and the gas barrier layer 130 is disposed on the release layer 120. The resin layer 140 includes the resin composition of the present disclosure and is disposed on the gas barrier layer 130. Further, the release layer 120 and the gas barrier layer 130 are disposed between the substrate 110 and the resin layer 140.

In some embodiments, the substrate 110 has a thickness of 2 μm to 200 μm, and can be exemplified by polyethylene terephthalate (PET), polymethylmethacrylate (PMMA), polyethersulfone, polycarbonate or polyimide, but it is not limited thereto. The release layer 120 has a thickness of 2 nm to 200 nm, and can be exemplified by tungsten oxide or silica material, but it is not limited thereto. Further, the silica material can be exemplified by KF96, KS-702 or KF96SP (purchased from TOPCO Technologies Corporation), but it is not limited thereto. The gas barrier layer 130 has a thickness of 2 nm to 200 nm, and is an inorganic film used to effectively prevent water and gases, such as silicon oxide, silicon nitride or a combination thereof, but it is not limited thereto. The resin layer 140 has a thickness of 5 μm to 600 μm, such as 20 μm to 200 μm. However, the resin layer 140 has the copolymer of the present disclosure so it can have the properties of yellowing resistance, heat resistance, high adhesion and flexibility even under the condition of higher thickness.

In some embodiments, the release layer 120 and the gas barrier layer 130 can be formed on the substrate 110 in sequence by evaporation deposition or sputter deposition. Subsequently, the resin layer 140 is formed on the gas barrier layer 130 by doctor blade coating or spin coating, and is dried to form a dry film at a temperature of 80° C. to 120° C. in an oven or a digital temperature controller. Further, the dry film can be collected in rolls by using a winder. However, the method of preparing the packaging film of the present disclosure is not limited thereto.

In some embodiments, the release layer 120 and the gas barrier layer 130 has an adhesive force of 65 nN/20 mm to 6000 nN/20 mm. The adhesive force can be measured by a 180° peeling test at a peeling speed of 0.3 to 100 m/min. When the substrate 110 is peeled off together with the release layer 120, the gas barrier layer 130 can be effectively fixed on the resin layer 140 through the adhesion between the resin layer and the barrier layer.

The packaging film of the present disclosure can be applied for the encapsulation of the large-area, thin-type and flexible OLED element, the packaging film encapsulate the OLED element by using hot-roll lamination. In some embodiments, the thermal transfer printing can be performed by controlling pressure, temperature, speed and pressing time of mechanical hot pressing machine, such as at the pressure of 2 Kg/cm², the temperature of 60° C. to 120° C., and the speed of 0.5 m/min. Owing to the heat melting properties of the resin layer itself, the packaging film can entirely cover the defects such as dust or microparticles existing on the OLED element to form a planarization layer on the OLED element. After cooling down to a room temperature, the substrate and the release layer can be directly peeled off from the gas barrier layer, so as to keep the gas barrier layer and the resin layer on the OLED element to form a package structure of the large-area OLED element for preventing influx of ambient gas or water vapor.

Figure 2:
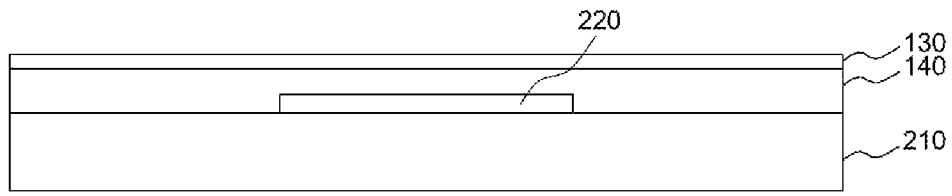
FIG. 2 is a schematic diagram showing the package structure according to one embodiment of the present disclosure.

FIG. 2 is a schematic diagram showing the package structure 200 according to one embodiment of the present disclosure. The package structure 200 includes a substrate 210, a semiconductor element 220, a resin layer 140 and a gas barrier layer 130. The semiconductor element 220 is disposed on the substrate 210, the resin layer 140 includes the resin composition of the present disclosure and encapsulates the semiconductor element 220, and the gas barrier layer 130 is disposed on the resin layer 140. Further, the resin layer 140 is disposed between the semiconductor element 220 and the gas barrier layer 130.

In some embodiments, the substrate 210 can be exemplified by polyethylene terephthalate (PET), polymethylmethacrylate (PMMA), polyethersulfone, polycarbonate or polyimide, but it is not limited thereto. The semiconductor element 220 can be exemplified by organic light-emitting diode (OLED), light-emitting diode (LED) or touch panel, but it is not limited thereto. The gas barrier layer 130 has a thickness of 2 nm to 200 nm, and is an inorganic film used to effectively prevent water and gases, such as silicon oxide, silicon nitride or a combination thereof, but it is not limited thereto. The resin layer 140 has a thickness of 5 μm to 600 μm, such as 20 μm to 200 μm. The resin layer 140 has the copolymer of the present disclosure so it can have the properties of yellowing resistance, heat resistance, high adhesion and flexibility even under the condition of higher thickness.

The copolymer of the present disclosure is synthesized by polymerization of at least three kinds of acrylate monomers each with specific substituents or silane groups grafting the silicone oligomer. Therefore, the copolymer of the present disclosure has the properties of yellowing resistance, heat resistance, high adhesion and flexibility, and can be used as the encapsulated material of large-area thermal transfer printing.

It should be noted that the above embodiments merely illustrate concrete examples of implementing the present disclosure, and it is not limited to the above methods or compounds of preparing the copolymer, the resin composition, the packaging film and the package structure.

Example 1 Copolymer 1

13 g of methacrylic acid (MAA), 33 g of methyl methacrylate (MMA), 70 g of benzyl methacrylate (BZMA), 35 g of 2-ethylhexyl methacrylate (EHMA), 16 g of 3-(trimethoxysilyl)propyl methacrylate, 0.8 g of thiol, and 0.8 g of azobisisobutyronitrile (AIBN) were dissolved in 180 g of propylene glycol monomethyl ether acetate (PGMEA), and stirred by the magnetic stir bar under a nitrogen atmosphere. The mixture was heated to 90° C. for 4 hours to obtain a resin precursor, which had an average solid content of 49.6% as determined by thermogravimetric analysis (Perkin-Elmer TGA-7), a weight average molecular weight (Mw) of 46340 as determined by gel permeation chromatography (WATERS Model 600), and an average viscosity of 14250 cps at 25° C. as determined by a viscograph (BROOKFIELD).

Subsequently, 120.2 g of the above resin precursor, and 18.8 g of silicone oligomer (Dow Corning 840, purchased from Dow Corning Corporation and having a molar ratio of phenyl groups to methyl groups of 2.07, as determined by ¹H-NMR) were dissolved in 300 g of propylene glycol monomethyl ether acetate (PGMEA), and stirred by the magnetic stir bar under a nitrogen atmosphere. The mixture was heated to 50° C.–60° C. for 4 hours to obtain the copolymer 1, which had an average solid content of 25.5% as determined by thermogravimetric analysis (Perkin-Elmer TGA-7), a weight average molecular weight (Mw) of 54850 as determined by gel permeation chromatography (WATERS Model 600), and an average viscosity of 3100 cps at 25° C. as determined by a viscograph (BROOKFIELD).

Example 2 Copolymer 2

13 g of methacrylic acid (MAA), 33 g of methyl methacrylate (MMA), 70 g of benzyl methacrylate (BZMA), 35 g of 2-ethylhexyl methacrylate (EHMA), 16 g of 3-(trimethoxysilyl)propyl methacrylate, 0.8 g of thiol, and 0.8 g of azobisisobutyronitrile (AIBN) were dissolved in 180 g of propylene glycol monomethyl ether acetate (PGMEA), and stirred by the magnetic stir bar under a nitrogen atmosphere. The mixture was heated to 90° C. for 4 hours to obtain a resin precursor, which had an average solid content of 49.6% as determined by thermogravimetric analysis (Perkin-Elmer TGA-7), a weight average molecular weight (Mw) of 46340 as determined by gel permeation chromatography (WATERS Model 600), and an average viscosity of 14250 cps at 25° C. as determined by a viscograph (BROOKFIELD).

Subsequently, 108.2 g of the above resin precursor, and 33.8 g of silicone oligomer (Dow Corning 804, purchased from Dow Corning Corporation and having a molar ratio of phenyl groups to methyl groups of 0.64, as determined by ¹H-NMR) were dissolved in 300 g of propylene glycol monomethyl ether acetate (PGMEA), and stirred by the magnetic stir bar under a nitrogen atmosphere. The mixture was heated to 50° C.–60° C. for 4 hours to obtain the copolymer 2, which had an average solid content of 25.1% as determined by thermogravimetric analysis (Perkin-Elmer TGA-7), a weight average molecular weight (Mw) of 55350 as determined by gel permeation chromatography (WATERS Model 600), and an average viscosity of 2950 cps at 25° C. as determined by a viscograph (BROOKFIELD).

Example 3 Resin Layer 1

100 g of copolymer 1, 6.5 g of epoxy monomer (Epon 828, purchased from Shell Chemical Corporation), 0.13 g of imidazole, and 20 g of PGMEA were mixed to obtain a resin composition. Subsequently, the resin composition was coated on a PET film having a size of 10 cm×10 cm by a spin coater so as to have a thickness of 40 μm, and was heated to 90° C. for 2 minutes to obtain the resin layer 1.

Example 4 Resin Layer 2

100 g of copolymer 12, 6.5 g of epoxy monomer (Epon 828, purchased from Shell Chemical Corporation), 0.13 g of imidazole, and 20 g of PGMEA were mixed to obtain a resin composition. Subsequently, the resin composition was coated on a PET film having a size of 10 cm×10 cm by a spin coater so as to have a thickness of 40 μm, and was heated to 90° C. for 2 minutes to obtain the resin layer 2.

Comparison Example 1 Resin Layer 3

25 g of methacrylic acid (MAA), 75 g of methyl methacrylate (MMA), 14 g of benzyl methacrylate (BZMA), 16 g of 2-hydroxyethyl methacrylate (2-HEMA), 1 g of thiol, and 1 g of azobisisobutyronitrile (AIBN) were dissolved in 300 g of propylene glycol monomethyl ether acetate (PGMEA), and stirred by the magnetic stir bar under a nitrogen atmosphere. The mixture was heated to 90° C. for 4 hours to obtain an acrylate resin, which had an average solid content of 39.6% as determined by thermogravimetric analysis (Perkin-Elmer TGA-7), a weight average molecular weight (Mw) of 34500 as determined by gel permeation chromatography (WATERS Model 600), and an average viscosity of 4850 cps at 25° C. as determined by a viscograph (BROOKFIELD).

Subsequently, 300 g of the above acrylate resin, 50 g of ethoxylated dipentaerythritol hexaacrylate (A-DPH-12E, purchased from KOWA Corporation), 0.3 g of 1,2-octanedione,1-[4-(phenylthio)phenyl]-,2-(o-benzoyl oxime), and 300 g of PGMEA were mixed to obtain a resin composition. Then, the resin composition was coated on a PET film having a size of 10 cm×10 cm by a spin coater so as to have a thickness of 40 μm, and was heated to 90° C. for 2 minutes to obtain the resin layer 3.

Comparison Example 2 Resin Layer 4

22 g of methacrylic acid (MAA), 36 g of methyl methacrylate (MMA), 72 g of benzyl methacrylate (BZMA), 16 g of 2-hydroxyethyl methacrylate (2-HEMA), 16 g of 3-(trimethoxysilyl)propyl methacrylate, 0.4 g of thiol, and 0.4 g of azobisisobutyronitrile (AIBN) were dissolved in 220 g of propylene glycol monomethyl ether acetate (PGMEA), and stirred by the magnetic stir bar under a nitrogen atmosphere. The mixture was heated to 90° C. for 4 hours to obtain a resin precursor, which had an average solid content of 40.2% as determined by thermogravimetric analysis (Perkin-Elmer TGA-7), a weight average molecular weight (Mw) of 24800 as determined by gel permeation chromatography (WATERS Model 600), and an average viscosity of 6200 cps at 25° C. as determined by a viscograph (BROOKFIELD).

Subsequently, 108.2 g of the above resin precursor, and 33.8 g of silicone oligomer (Dow Corning 840, purchased from Dow Corning Corporation and having a molar ratio of phenyl groups to methyl groups of 2.07, as determined by $^1$H-NMR) were dissolved in 300 g of propylene glycol monomethyl ether acetate (PGMEA), and stirred by the magnetic stir bar under a nitrogen atmosphere. The mixture was heated to 50° C.–60° C. for 4 hours to obtain the copolymer 3, which had an average solid content of 25.5% as determined by thermogravimetric analysis (Perkin-Elmer TGA-7), a weight average molecular weight (Mw) of 58500 as determined by gel permeation chromatography (WATERS Model 600), and an average viscosity of 2950 cps at 25° C. as determined by a viscograph (BROOKFIELD).

100 g of copolymer 3, 6.5 g of epoxy monomer (Epon 828, purchased from Shell Chemical Corporation), 0.13 g of imidazole, and 20 g of PGMEA were mixed to obtain a resin composition. Then, the resin composition was coated on a PET film having a size of 10 cm×10 cm by a spin coater so as to have a thickness of 40 and was heated to 90° C. for 2 minutes to obtain the resin layer 4.

Comparison Example 3 Resin Layer 5

30 g of 2-hydroxyethyl methacrylate (2-HEMA), 45 g of 2-ethylhexyl methacrylate (2-EHMA), 45 g of tert-butyl methacrylate (TBMA), 16 g of 3-(trimethoxysilyl)propyl methacrylate, 0.8 g of thiol, and 0.8 g of azobisisobutyronitrile (AIBN) were dissolved in 350 g of propylene glycol monomethyl ether acetate (PGMEA), and stirred by the magnetic stir bar under a nitrogen atmosphere. The mixture was heated to 90° C. for 4 hours to obtain a resin precursor, which had an average solid content of 40.5% as determined by thermogravimetric analysis (Perkin-Elmer TGA-7), a weight average molecular weight (Mw) of 25500 as determined by gel permeation chromatography (WATERS Model 600), and an average viscosity of 6250 cps at 25° C. as determined by a viscograph (BROOKFIELD).

Subsequently, 108.2 g of the above resin precursor, and 33.8 g of silicone oligomer (Dow Corning 840, purchased from Dow Corning Corporation and having a molar ratio of phenyl groups to methyl groups of 2.07, as determined by $^1$H-NMR) were dissolved in 300 g of propylene glycol monomethyl ether acetate (PGMEA), and stirred by the magnetic stir bar under a nitrogen atmosphere. The mixture was heated to 50° C.–60° C. for 4 hours to obtain the copolymer 4, which had an average solid content of 26.0% as determined by thermogravimetric analysis (Perkin-Elmer TGA-7), a weight average molecular weight (Mw) of 61500 as determined by gel permeation chromatography (WATERS Model 600), and an average viscosity of 2950 cps at 25° C. as determined by a viscograph (BROOKFIELD).

100 g of copolymer 4, 6.5 g of epoxy monomer (Epon 828, purchased from Shell Chemical Corporation), 0.13 g of imidazole, and 20 g of PGMEA were mixed to obtain a resin composition. Then, the resin composition was coated on a PET film having a size of 10 cm×10 cm by a spin coater so as to have a thickness of 40 μm, and was heated to 90° C. for 2 minutes to obtain the resin layer 5.

Test Example

The above resin layer 1, resin layer 2, resin layer 3, resin layer 4, and resin layer 5 were respectively formed on a glass substrate by using thermal transfer process. Then, the flexibility test, the adhesion test, and the heat resistance test were conducted, and the test results were listed in Table 1. The adhesion test was performed by using a cross-cut tester, while the heat resistance test was performed by measuring the yellow index (b*) under conditions of 240° C. for 1 hour. As shown in Table 1, the resin layer 3 synthesized without polysiloxane had poor flexibility, adhesion, and yellowing resistance; the resin layer 4 synthesized without a repeating unit represented by formula (II) had poor flexibility; the resin layer 5 synthesized without a repeating unit represented by formula (I) had poor yellowing resistance. As compared with the resin layer 3, the resin layer 4, and the resin layer 5, the resin layer 1 and resin layer 2 with the copolymer of the present disclosure had better flexibility, adhesion, and yellowing resistance.

TABLE 1

|  | Yellow Index (b*) | Adhesion | Flexibility |
|---|---|---|---|
| resin layer 1 | 1.61 | 5B | GOOD |
| resin layer 2 | 1.05 | 5B | GOOD |
| resin layer 3 | 5.76 | 2B | POOR |
| resin layer 4 | 1.25 | 4B | POOR |
| resin layer 5 | 2.66 | 5B | GOOD |

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A copolymer comprising 30 to 80 mol % of a repeating unit represented by formula (I), 5 to 25 mol % of a repeating unit represented by formula (II), and 5 to 30 mol % of a repeating unit represented by formula (III):

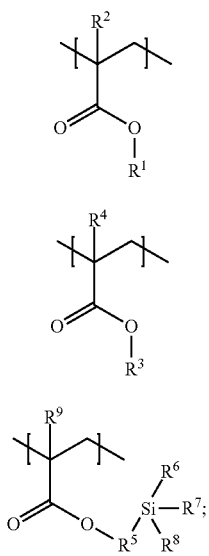

formula (I)

formula (II)

formula (III)

wherein, $R^1$ is C6-C13 aryl group, C7-C13 aralkyl group, C6-C8 halogenated aryl group or C7-C8 aryloxyalkyl group;

$R^3$ is C3-C16 alkyl group or C3-C6 alkoxy substituted alkyl group;

$R^5$ is a single bond or C1-C3 alkylene group;

$R^6$ and $R^7$ are independently C1-C3 alkoxy group;

$R^8$ is polysiloxane with methyl and phenyl groups; and $R^2$, $R^4$ and $R^9$ are independently hydrogen or methyl.

2. The copolymer as claimed in claim 1, further comprising a repeating unit represented by formula (IV):

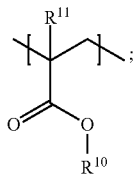

formula (IV)

wherein, $R^{10}$ is hydrogen, methyl, hydroxyethyl or hydroxypropyl; and $R^{11}$ is hydrogen or methyl.

3. The copolymer as claimed in claim 1, wherein the copolymer comprises 30 to 50 mol % of a repeating unit represented by formula (I), 5 to 25 mol % of a repeating unit represented by formula (II), 5 to 30 mol % of a repeating unit represented by formula (III), and 10 to 30 mol % of a repeating unit represented by formula (IV).

4. The copolymer as claimed in claim 1, wherein $R^1$ is benzyl, phenyl, phenylethyl, chlorophenyl, pentabromophenyl, pentafluorophenyl, tribromophenyl, benzhydryl or phenoxyethyl.

5. The copolymer as claimed in claim 1, wherein $R^3$ is tert-amyl, n-butoxyethyl, tert-butyl, n-butyl, iso-butyl, sec-butyl, iso-decyl, n-decyl, n-dodecyl, ethoxyethoxy ethyl, ethylhexy, hexadecyl, n-hexyl, methoxyethyl, n-octyl or n-propyl.

6. The copolymer as claimed in claim 1, wherein $R^5$ is a single bond or propylene, $R^6$ and $R^7$ are independently methoxy or ethoxy.

7. The copolymer as claimed in claim 1, wherein a repeating unit of the polysiloxane comprises

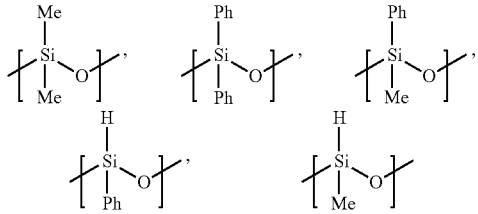

or a combination thereof, wherein Me is methyl, and Ph is phenyl.

8. The copolymer as claimed in claim 7, wherein a molar ratio of phenyl groups to methyl groups in the polysiloxane is 3 or less.

9. The copolymer as claimed in claim 7, wherein the polysiloxane has a weight average molecular weight of 500 to 20000.

10. A resin composition, comprising
the copolymer as claimed in claim 1; and
an epoxy, wherein a weight ratio of the epoxy to the copolymer is from 0.01 to 1.

11. The resin composition as claimed in claim 10, further comprising a solvent having a content of 40 to 80% by weight based on the total weight of the resin composition.

12. The resin composition as claimed in claim 10, further comprising an accelerator having a content of 0.05 to 5% by weight based on the total weight of the resin composition.

13. The resin composition as claimed in claim 10, wherein the epoxy has a content of 5 to 10% by weight based on the total weight of the resin composition.

14. The resin composition as claimed in claim 10, wherein the epoxy has a weight average molecular weight of 150 to 300 and a viscosity of 3 to 300 cps.

15. A packaging film, comprising
a substrate;
a release layer, disposed on the substrate;
a gas barrier layer, disposed on the release layer; and
a resin layer, disposed on the gas barrier layer and comprising the resin composition as claimed in claim 10.

16. The packaging film as claimed in claim 15, wherein an adhesive force between the release layer and the gas barrier layer is from 65 to 6000 nN/20 mm.

17. The packaging film as claimed in claim 15, wherein the release layer comprises tungsten oxide or silica material.

18. The packaging film as claimed in claim 15, wherein the gas barrier layer comprises silicon oxide, silicon nitride or a combination thereof.

19. The packaging film as claimed in claim 15, wherein the substrate comprises polyethylene terephthalate, polymethylmethacrylate, polyethersulfone, polycarbonate or polyimide.

20. The packaging film as claimed in claim 15, wherein the substrate has a thickness of 2 μm to 200 μm, the release layer has a thickness of 2 nm to 200 nm, the gas barrier layer has a thickness of 2 nm to 200 nm, and the resin layer has a thickness of 5 μm to 600 μm.

21. A package structure, comprising
a substrate;
a semiconductor element, disposed on the substrate;
a resin layer, encapsulating the semiconductor element and comprising the resin composition as claimed in claim 10; and
a gas barrier layer, disposed on the resin layer.

22. The package structure as claimed in claim 21, wherein the substrate comprises polyethylene terephthalate, polymethylmethacrylate, polyethersulfone, polycarbonate or polyimide.

23. The package structure as claimed in claim 21, wherein the gas barrier layer comprises silicon oxide, silicon nitride or a combination thereof.

24. The package structure as claimed in claim 21, wherein the resin layer has a thickness of 5 μm to 600 μm, and the gas barrier layer has a thickness of 2 nm to 200 nm.

* * * * *